United States Patent [19]

Fushimoto

[11] Patent Number: 4,661,889
[45] Date of Patent: Apr. 28, 1987

[54] ELECTRONIC APPARATUS WITH A BATTERY

[75] Inventor: Hideo Fushimoto, Tokyo, Japan

[73] Assignee: Canon Kabushiki Kaisha, Tokyo, Japan

[21] Appl. No.: 796,421

[22] Filed: Nov. 8, 1985

[30] Foreign Application Priority Data

Nov. 16, 1984 [JP] Japan .................. 59-241687

[51] Int. Cl.⁴ .................... H05K 5/04; H05K 1/04
[52] U.S. Cl. .................................. 361/424; 361/395; 320/2; 429/170
[58] Field of Search .............. 339/193 P, 143 R; 320/2; 429/170; 200/5 R, 5 A, 304, 305; 361/395, 399, 405, 406, 412, 413, 424, 212, 220

[56] References Cited

U.S. PATENT DOCUMENTS

| 4,120,022 | 10/1978 | Perkins | 361/395 |
| 4,213,078 | 7/1980 | Ferrell | 320/2 |
| 4,457,575 | 7/1984 | Davis | 339/143 R |
| 4,513,354 | 4/1985 | Abel | 361/395 |

Primary Examiner—G. P. Tolin
Attorney, Agent, or Firm—Spencer & Frank

[57] ABSTRACT

A contact member having one end contacting an electrode of a battery and other end connected to a grounding line disposed on a printed circuit board and a contact portion formed integrally with the contact member and having one end contacting a noise shield plate are disposed in an electronic apparatus having a battery as an electrical power source. This arrangement provides a good electrical shield against noise, and eliminates components such as a lead wire soldered to a grounding line disposed on the printed circuit board, permitting a large reduction in the number of assembly steps, and a reduction of component costs.

18 Claims, 12 Drawing Figures

FIG. 1

PRIOR ART

FIG. 2

PRIOR ART

FIG. 3

PRIOR ART

ELECTRONIC APPARATUS WITH A BATTERY

BACKGROUND OF THE INVENTION

1. Field of the Invention

The present invention relates to an electronic apparatus having a battery as an electrical power source, and more particularly to a comparatively small electronic apparatus such as a calculator, a pocket radio receiver, a tape recorder, a tester or a video camera.

2. Description of the Prior Art

In an electronic apparatus such as described above, as an electrical power consumption in calculation and other electronic circuits has decreased, a density of central processing units has increased, and a mounting density of printed circuit boards, LSIs, ICs and other electronic components or devices has increased, disadvantages such as malfunctions and destruction of central processing units due to static electricity and radio wave noise from external sources have occurred. Furthermore, there has been a concern that noise generated by a motor disposed inside the electronic apparatus may cause malfunctions in the electronic circuits and that radio waves generated by an oscillator which is one of the electronic circuits in the apparatus may become a noise source to other electronic apparatus such as a radio receiver.

A grounded conductive member which has a wide surface area and is mounted to an apparatus as a noise shield plate is an example of means for eliminating these defects.

Figure 1:
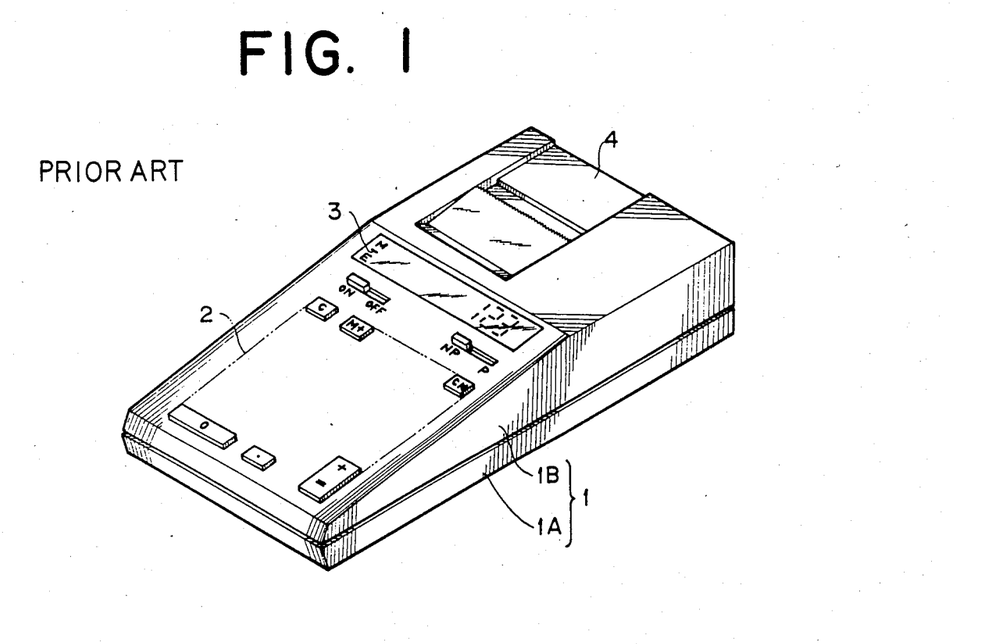
FIG. 1 is a perspective view showing an external appearance of a conventional electronic apparatus having a battery as an electrical power source.

FIG. 1 shows an outer appearance of a calculator with a printer having recording functions as an example of this type of small electronic apparatus.

In FIG. 1, reference numeral 1 denotes an outer case of the apparatus. The outer case 1 has a lower case 1A and an upper case 1B which are engaged with each other or abutted on each other. These half cases 1A and 1B are secured to each other to form a single structure by a screw or similar member.

In an inner space in a front portion of the outer case 1, formed is a housing portion for an electronic calculation circuit and a battery as an electrical power source. An inner space in a rear portion of the outer case 1 houses a printer mechanism of a suitable system. A recording paper is housed in a rear portion of the printer mechanism. A cover 4 is disposed so as to cover the recording paper.

A keyboard portion 2 for inputting numerical data and operators is disposed on the surface of the front half portion of the upper case 1B. Moreover, a display device 3 for displaying input data and the results of calculations is disposed in a boundary portion between the front portion and the rear portion of the upper case 1B.

Next, an explanation will be made of the arrangement in the vicinity of the battery housing portion disposed in the inner space of the front portion of the outer case 1 of the apparatus with reference to FIGS. 2 and 3.

Figure 2:
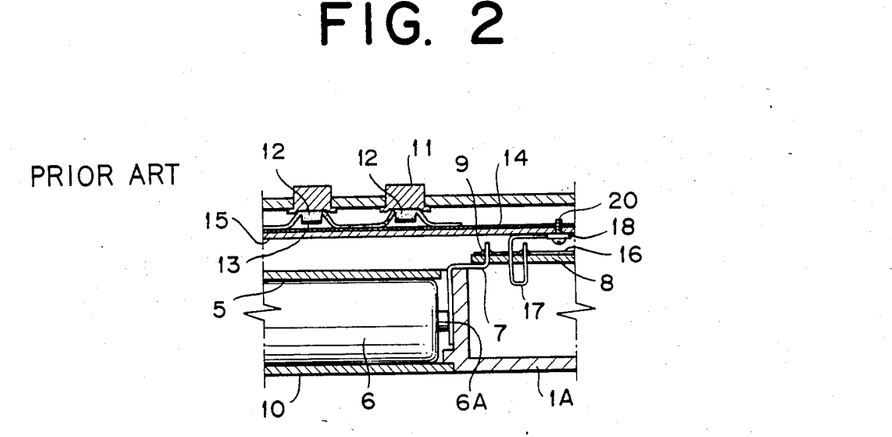
FIG. 2 is a cross-sectional view showing an arrangement around a battery housing portion in an electronic apparatus shown in FIG. 1.
Figure 3:
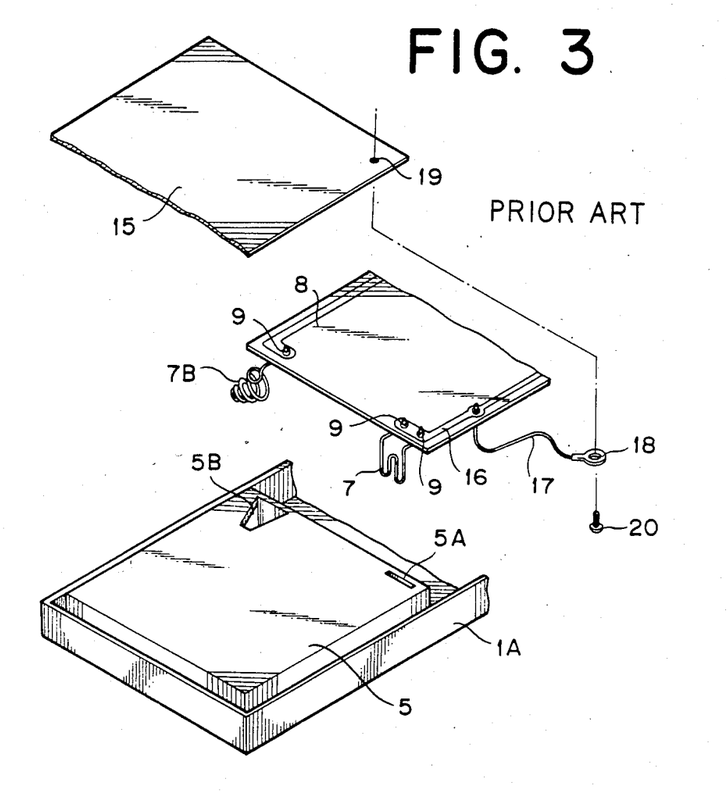
FIG. 3 is a perspective view showing the disassembly of the arrangement shown in FIG. 2.

FIG. 2 is a cross-sectional view, and FIG. 3 is a perspective view showing a disassembled arrangement corresponding to FIG. 2.

As shown in FIG. 2, in an apparatus having a primary battery as an electrical power source, the predetermined number of batteries 6 are housed in a housing portion 5 recessed in the lower case 1A in order to facilitate to replace these batteries An electrode 6A of the battery 6 contacts a connecting member 7 disposed in the housing portion 5 so as to supply electrical power.

In order to electrically connect a printed circuit board 8 on which electronic circuits are disposed to the connecting member 7, generally used is a method of connecting the connecting member 7 to a predetermined pattern on the printed circuit board 8 via a lead wire or the like. Alternatively, as shown in FIG. 2, the connecting member 7 is directly soldered to the printed circuit board 8 with a solder 9 so as to reduce the number of assembly steps.

Further, reference numeral 10 denotes a lid mounted detachably to the battery housing portion 5 so that it can be opened and closed when replacing the battery 6.

The keyboard portion 2 for inputting numerical data and operators, which is formed on the top of the upper case 1B, has key buttons. On the upper surface of the key buttons, the content or function of an input such as numbers and symbols are indicated. Each key button 11 which is movable upward and downward with respect to the upper case 1B is positioned by a key rubber 12 formed from a resilient member in a condition so that the key button 11 is always biased upward.

A movable contact 13 made from a conductive material is integrally formed on the lower surface of the key rubber 12 by printing or molding. When the movable contact 13 contacts a corresponding key pattern disposed on a key printed circuit board 14, a key input signal is generated.

Reference numeral 15 denotes a reinforcement plate mounted on the lower surface of the key printed circuit board 14 so as to reinforce the key printed circuit board 14. The reinforcement plate 15 is formed from a metal material in the form of thin sheet having adequate strength. The key rubber 12, key printed circuit board 14 and the reinforcement plate 15 are securely attached to the upper case 1B.

In this calculator with printer which is an example of the prior art, the reinforcement plate 15 that is made from a metal member is connected to a grounding line, and is used as a noise shield plate to increase resistance to noise and resistance to static electricity.

As shown in FIG. 3, a lead wire 17 is soldered to a portion of a grounding pattern 16 formed on the printed circuit board 8. A lug terminal 18 is attached to an end of this lead wire 17, and this lug terminal 18 is tightly attached by a screw 20 to an attaching hole 19 formed in the reinforcement plate 15 so that the reinforcement plate 15 is electrically connected to the grounding line.

Reference numeral 7B in FIG. 3 denotes a connecting member contacting a negative electrode of the battery 6. Reference numerals 5A and 5B denote openings for inserting connecting members 7 and 7B respectively into the battery housing portion 5.

The above arrangement involves, however, the additional operations of soldering the lead wire 17 and of tightening the lug terminal 18 on the reinforcement plate 15 by the screw 20, thereby increasing the number of assembly steps and the costs of components. Additionally, defects that the lead wire 17 may be caught between the outer cases 1A and 1B when engaging the lower case 1A with the upper case 1B, and that the lead wire 17 may be broken erroneously during assembly because the reinforcement plate 15 and the printed circuit board 8 are always connected by this thin lead wire 17.

SUMMARY OF THE INVENTION

It is, therefore, an object of the present invention to provide an electronic apparatus which eliminates such disadvantages in existing arrangements and which has a simple arrangement and allows for secure electrical connection of a noise shield plate with a grounding line.

It is another object of the present invention to provide an electronic apparatus having an arrangement whose assembly work is simple, and which has a good workability.

In the first aspect of the present invention, an electronic apparatus having a battery as an electrical power source comprises:

a recessed portion for housing a battery;

a printed circuit board on which an electronic circuit is disposed; and a noise shield plate of a conductive material for shielding electrically the electronic circuit from electrical noise;

a contact member secured to the printed circuit board to contact an electrode of the battery; and a contact portion formed integrally with the contact member so that a portion of the contact portion contacts the noise shield plate.

Here, the noise shield plate may be a reinforcement plate for another printed circuit board disposed in the electronic apparatus.

The noise shield plate may be a metal plate.

The electronic apparatus having a battery as an electrical power source may further comprise a motor in the electronic apparatus, and the noise shield plate may be disposed at a position between the motor and the printed circuit board.

The contact member and the contact portion may be in the form of conductive wire. The contact member may be formed by a conductive sheet.

The positive electrode of the battery may be connected electrically to a grounding line disposed on the printed circuit board via the contact member The negative electrode of the battery may be connected electrically to a grounding line disposed on the printed circuit board via the contact member.

In the second aspect of the present invention, an electronic apparatus having a battery as an electrical power source comprises:

a recessed portion for housing a battery;

a printed circuit board on which an electronic circuit is disposed;

a first conductive member in a sheet form; and a second conductive member connected to a grounding line disposed on the printed circuit board so that both ends of the second conductive member extend in different directions.

Here, one end of the conductive member may be connected to an electrode of the battery, and another end may be connected to the first conductive member.

Both ends of the second conductive member may be in the form of a wire. One end of the second conductive member may be in the form of a sheet and another end may be in the form of a wire. The first conductive member may be a reinforcement plate for another printed circuit board.

The electronic apparatus having a battery as an electrical power source may further comprise a motor housed in the electronic apparatus, and the first conductive member may be disposed at a position between the motor and the printed circuit board.

The above and other objects, effects, features and advantages of the present invention will become more apparent from the following description of preferred embodiments thereof taken in conjunction with the accompanying drawings.

DETAILED DESCRIPTION OF PREFERRED EMBODIMENTS

Figure 4:
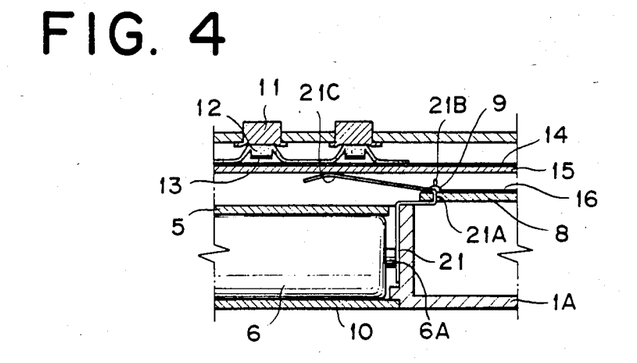
FIG. 4 is a cross-sectional view showing a portion around a battery housing portion in an electronic apparatus according to the present invention.
Figure 5:
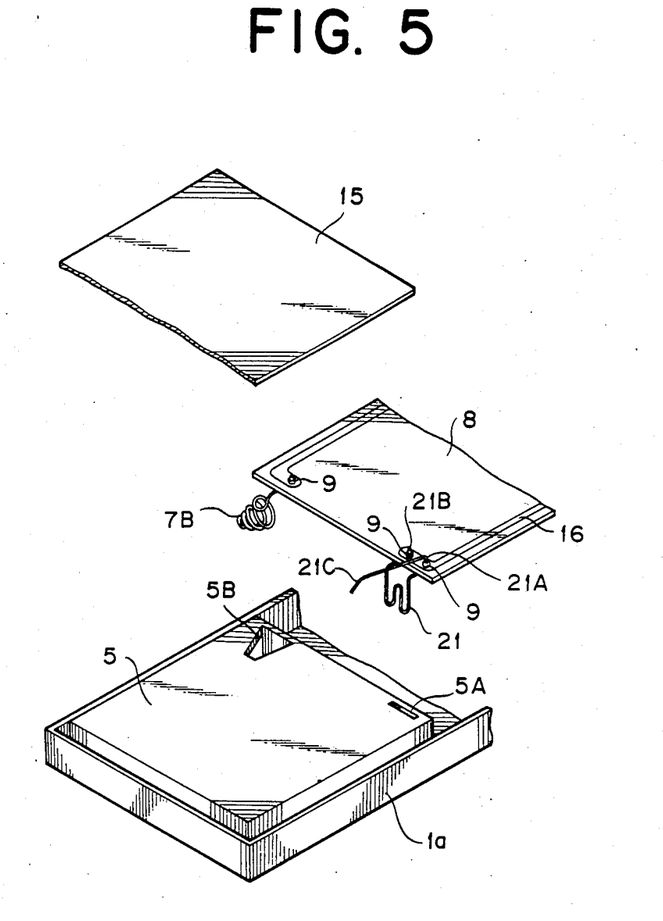
FIG. 5 is a perspective view showing the disassembly of the arrangement shown in FIG. 4.

FIG. 4 and FIG. 5 show an embodiment of an electronic apparatus according to the present invention. In the drawings, portions which are the same as, or equivalent to portions in the conventional arrangements shown in FIGS. 1–3 are denoted by the same reference numerals, and a detailed explanation of such portions will not be made.

FIG. 4 is a cross-sectional view showing a portion around a battery housing portion in the embodiment of the present invention.

In FIG. 4, reference numeral 21 denotes a contact member for contacting a positive electrode 6A of a battery, and reference numeral 21C a contact portion formed integrally with the contact member 21.

In the present embodiment, the contact member 21 is secured by solder to the printed circuit board 8 on which electronic circuits are disposed and contact an electrode 6A of the battery 6. The contact portion 21C which extends upward and leftward in FIG. 4 is formed integrally with the contact member 21.

As shown in FIG. 4, after the assembly of the electronic apparatus, this contact portion 21C contacts a reinforcement plate 15 made from a metal member which is mounted on the lower surface of the key printed circuit board 14. Because the ground potential is the same as that of one electrode of a battery, the reinforcement plate 15 functions as a noise shield plate.

FIG. 5 is a perspective view showing the disassembly of the arrangement shown in FIG. 4. The contact member 21 formed integrally with the contact portion 21C is secured to the printed circuit board 8 by the solder 9.

Figure 6:
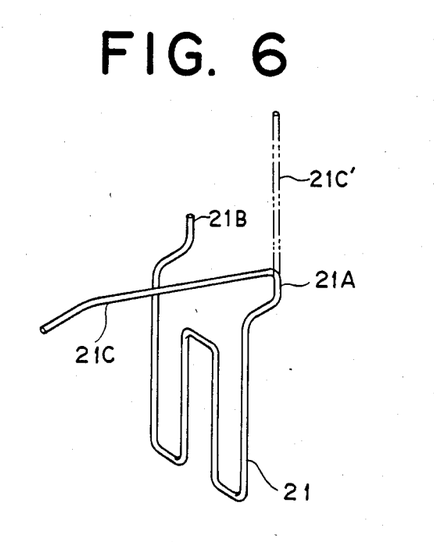
FIG. 6 is a perspective view showing an embodiment of a contact member for a positive electrode formed by a wire member.

FIG. 6 shows the contact member 21 in which the contact portion 21C extends from an end 21A of the conductive wire member.

Figure 7:
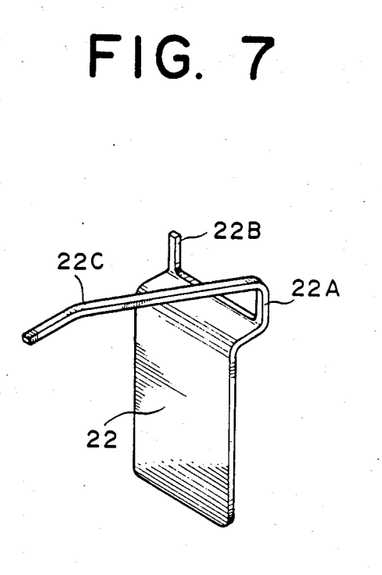
FIG. 7 is a perspective view showing an embodiment of a contact member for a positive electrode formed by a sheet member.

FIG. 7 shows a contact member 22 having an extended contact portion 22C extending from an end 22A of the contact member 22 made by folding a conductive sheet.

In FIGS. 6 and 7, reference numerals 21B and 22B denote the end on the opposite sides of the ends 21A and 22A of the contact members 21 and 22, respectively.

Figure 8:
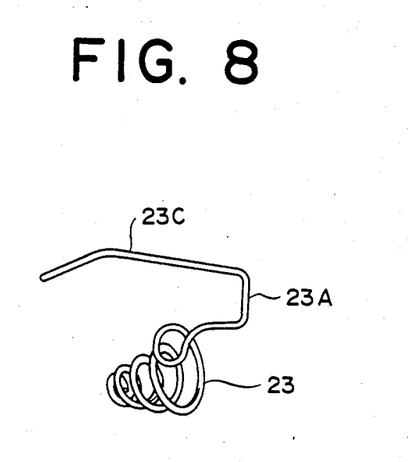
FIG. 8 is a perspective view showing an embodiment of a contact member for a negative electrode formed by a wire member.

An explanation has been made of an arrangement of the embodiments shown in FIG. 6 and FIG. 7 in which the contact members 21 and 22 for the positive side electrode of the battery is extended so as to perform a grounding connection. In cases where the negative side electrode is used as the grounding due to the nature of the apparatus, the negative side electrode contact member is connected to the grounding line of the printed circuit board in a manner as shown in FIG. 8. That is, an end 23A of a contact member 23 is extended, as shown in FIG. 8 to form a contact portion 23C, so that the noise shield plate is connected electrically the grounding line. It is preferable that the portions of the contact portions 21C, 22C and 23C that contact the noise shield plate are of a curved wire form.

An explanation will be made of an example of a procedure for mounting the contact member 21 to the printed circuit board 8.

First, the contact member 21 is prepared in a form that the contact portion 21C and the end 21A are straightened to form a straight line as shown by reference numeral 21C' in FIG. 6. Both ends 21A (21C) and 21B are then inserted into the through holes in the printed circuit board 8, and both ends 21A and 21B are secured to the grounding line 16 with the solder 9. Finally, the contact portion 21C is bent into a predetermined form.

When using a flexible printed circuit board as the printed circuit board 8, or when making the through holes sufficiently large, the contact member 21 in the form shown in FIG. 5 can be used without the above-described preparation and the bending of the straight line. In this case, first, the contact member is inserted into the through hole in the printed circuit board 8 from the contact portion 21C to the end 21A, then another end 21B on the opposite side can be inserted into another through hole. After the insertion of both ends 21A and 21B, these ends 21A and 21B are secured to the grounding line 16 by the solder 9.

Another example of a procedure for fixing the contact member 21 to the printed circuit board 8 will be explained with reference to FIGS. 9, 10 and 11.

Figure 9:
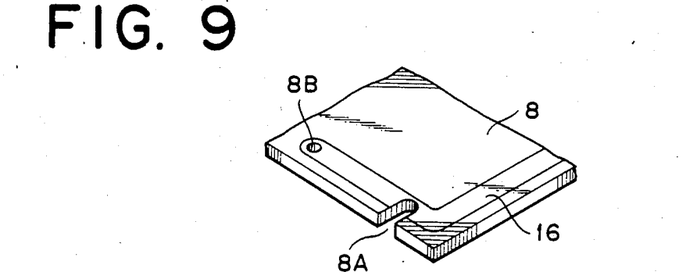
FIGS. 9, 10 and 11 are perspective views showing a procedure of attaching the contact member shown in FIG. 6 to a printed circuit board.

In FIG. 9, a notch 8A reaching as far as the grounding line 16, and a through hole 8B are formed in the printed circuit board 8.

Figure 10:
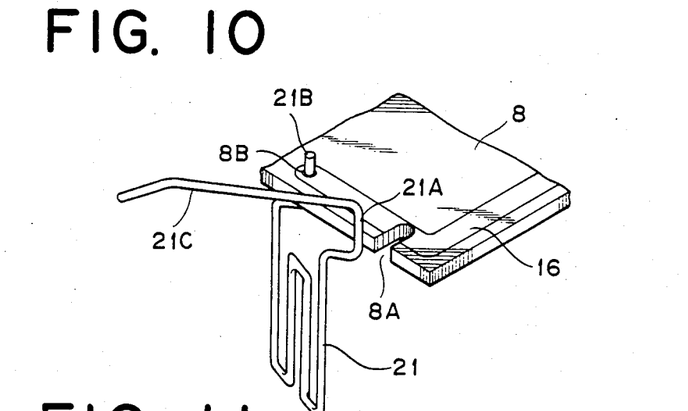

When assembling, first, the end 21B on the opposite side of the end 21A of the contact member 21 is inserted into the through hole 8B, as shown in FIG. 10.

Figure 11:
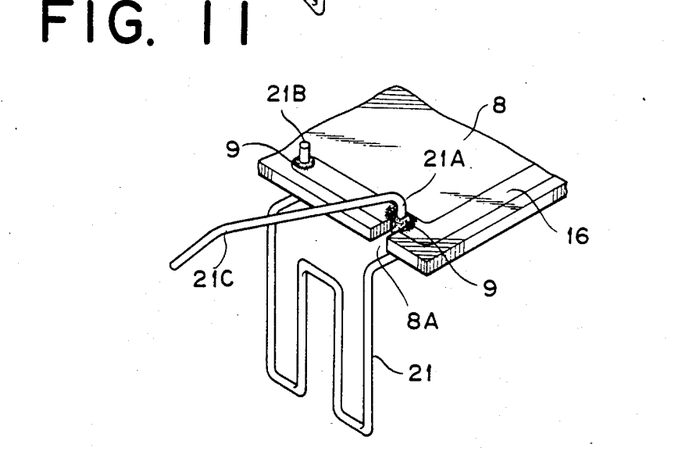

Then, as shown in FIG. 11, the end 21A which is integral with the contact portion 21C is inserted into the notch 8A. Then, both the ends 21A and 21B are secured to the grounding line 16 by the solder 9.

The sheet-form contact member 22 shown in FIG. 7 can also be secured to the printed circuit board 8 following exactly the same procedure as that for the contact member 21.

Since, in FIG. 8, the contact member 23 on the negative electrode side of the battery has only one securing portion, the end 23A can be inserted into either the notch 8A or the through hole 8B formed in the printed circuit board 8, and then secured to the grounding line by the solder 9.

In this manner, a contact member contacting an electrode of a battery is formed integrally with a contact portion contacting a reinforcement plate made from a metal member and secured to a printed circuit board, so that the grounding line 16 on the printed circuit board 8 and the reinforcement plate 15 have the same electrical potential via the contacting portion 21, 22 or 23. As a result, the reinforcement plate 15 functions as a noise shield plate, so that the resistance of the apparatus to noise and to static electricity are improved.

Figure 12:
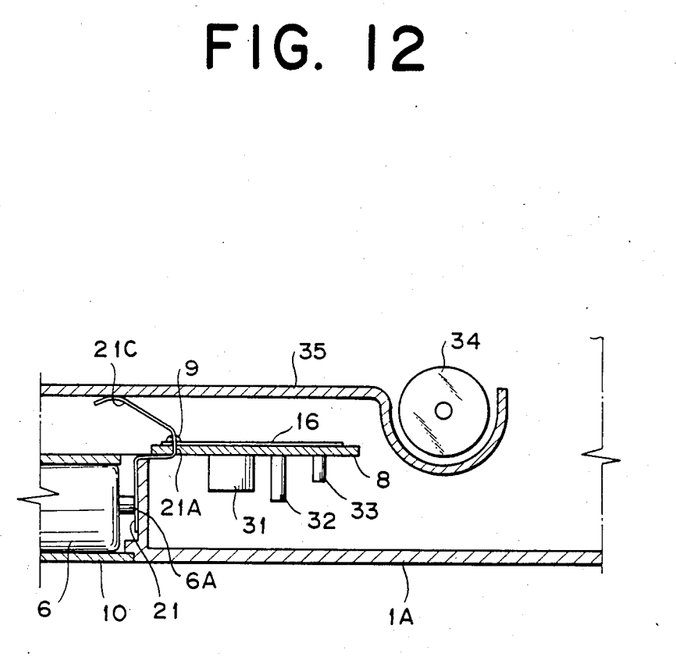
FIG. 12 is a cross-sectional view showing a portion around a motor in another embodiment of an electronic apparatus according to the present invention.

FIG. 12 shows another embodiment of an electronic apparatus according to the present invention. In FIG. 12, reference numerals 31, 32 and 33 denote electronic components mounted on the printed circuit board 8, respectively. For example, the component 31 is an LSI. The component 32 is an oscillator. The component 33 is a capacitor. Reference numeral 34 denotes a motor which is provided in a calculator with a printer for feeding recording paper or for moving a recording head. Reference numeral 35 denotes a noise shield plate disposed at a position between the motor 34 and the printed circuit board 8. The noise shield plate 35 can also be a reinforcement plate for the printed circuit board 8, or simply a metal plate.

The contact portion 21C that extends integrally from the end 21A of the contact member 21 contacts the noise shield plate 35. The end 21A is secured to the grounding line 16 by the solder 9.

Consequently, the electronic component such as the LSI 31 or the oscillator 32 is not liable to malfunctions due to radio wave noise from external sources or due to noise generated by the motor 35 in the electronic apparatus. Furthermore, leakage of radio waves generated by the oscillator 32 to the outside of the electronic apparatus is prevented by the noise shield plate 35, so that such radio waves do not become a noise source against radio receiver or other electronic apparatus.

In the arrangement of these embodiments described above, a member corresponding to the lead wire 17 in the conventional arrangement is not required and therefore the need for soldering this lead wire 17 and for tightening the lug terminal 18 mounted to an end of the lead wire 17 to the noise shield plate 15 by the screw 20 are eliminated. Accordingly, it is possible to reduce the number of assembly steps and to reduce component costs.

Furthermore, the present invention ensures the elimination of defects such as catching the lead wire between the outer lower case 1A and the outer upper case 1B when engaging the cases with each other and erroneously breaking the lead wire 17 during the assembly.

As explained above, an electronic apparatus according to the present invention has the contact portion extending in a predetermined direction and formed integrally with the contacting member secured to the printed circuit board. The contact portion contacts the noise shield plate made from a conductive member. As a result, it is possible to eliminate components such as a lead wire which were secured by solder to the grounding pattern disposed on the printed circuit board in conventional arrangements. Thus, the arrangement according to the present invention provides various advantageous effects such as permitting a large reduction in the number of assembly steps, and a reduction of component costs.

What is claimed is:

1. An electronic apparatus having a battery as an electrical power source, comprising
   a housing having a recessed portion;
   a battery provided in the recessed portion of the housing and having a positive electrode and a negative electrode;
   a printed circuit board provided in the housing and an electronic circuit disposed on the printed circuit board; the printed circuit board being provided with two holes and at least one of said holes being formed in the electronic circuit;
   a conductive noise shield plate provided in the housing for electrically shielding the electronic circuit from electrical noise; and
   a contact member made of bent wire having two ends, a contact portion formed in the vicinity of one end of the wire, a multiply bent first electrode portion contacting one electrode of the battery and a separate second electrode portion, wherein the wire is bent at the second electrode portion, and the second electrode portion and the other end of the wire are inserted into one of the two holes to secure at least one of the second electrode portion and the other end of the wire to the electronic circuit so that the first electrode portion and the contact portion contact the noise shield plate.

2. The electronic apparatus of claim 1, wherein
   the noise shield plate is a reinforcement plate for a printed circuit board other than the printed circuit board disposed in the electronic apparatus.

3. The electronic apparatus of claim 1, wherein the noise shield plate is a metal plate.

4. The electronic apparatus of claim 1, further comprising
   a motor; and wherein
   the noise shield plate is placed between the motor and the printed circuit board.

5. The electronic apparatus of claim 1, further comprising
   a grounding line disposed on the printed circuit board through the contact member; and wherein
   the positive electrode is electrically connected to the grounding line.

6. The electronic apparatus of claim 1, further comprising
   a grounding line disposed on the printed circuit board through the contact member; and wherein
   the negative electrode is electrically connected to the grounding line.

7. An electronic apparatus having a battery as an electrical power source, comprising
   a housing having a recessed portion;
   a battery provided in the recessed portion of the housing and having a positive electrode and a negative electrode;
   a printed circuit board provided in the housing and an electronic circuit disposed on the printed circuit board; the printed circuit board being provided with two holes and at least one of the holes being formed in the electronic circuit;
   a conductive noise shield plate provided in the housing for electrically shielding the electronic circuit from electrical noise; and
   a contact member made of a plate contacting an electrode and provided with first and second projections, wherein the second projection has a root portion and an end portion and is longer than the first projection and the first projection has an end portion, and the end portion of the first projection and the root portion of the second projection are inserted into one of the holes to secure at least one of the projections to the electronic circuit with solder so that the plate of the contact member and the second projection contact the noise shield plate through the end portion of the second projection.

8. The electronic apparatus of claim 7, wherein
   the noise shield plate is a reinforcement plate for a printed circuit board other than the printed circuit board disposed in the electronic apparatus.

9. The electronic apparatus of claim 7, wherein the noise shield plate is a metal plate.

10. The electronic apparatus of claim 7, further comprising
    a motor; and wherein
    the noise shield plate is placed between the motor and the printed circuit board.

11. The electronic apparatus of claim 7 further comprising
    a grounding line disposed on the printed circuit board through the contact member; and wherein
    the positive electrode is electrically connected to the grounding line.

12. The electronic apparatus of claim 7, further comprising
    a grounding line disposed on the printed circuit board through the contact member; and wherein
    the negative electrode is electrically connected to the grounding line.

13. An electronic apparatus having a battery as an electrical power source, comprising
    a housing having a recessed portion;
    a battery provided in the recessed portion of the housing and having a positive electrode and a negative electrode;
    a printed circuit board provided in the housing and an electronic circuit disposed on said printed circuit board; the printed circuit board being provided with two holes and at least one of the holes being formed in the electronic circuit;
    a first conductive member made of a sheet and secured to the printed circuit board; and
    a second conductive member made of bent wire having two ends, a contact portion formed in the vicinity of one end of the wire, a multiply bent first electrode portion contacting one electrode of the battery and a separate second electrode portion, wherein the wire is bent at the second electrode portion, and the second electrode portion and the other end of the wire are inserted into one of the holes to secure at least one of the second electrode and the other end of the wire to the electronic circuit so that the first electrode portion and the contact portion contact the first conductive member.

14. The electronic apparatus of claim 13, wherein
    the first conductive member is a reinforcement plate for a printed circuit board other than the printed circuit board disposed in the electronic apparatus.

15. The electronic apparatus of claim 13, further comprising
- a motor; and wherein
- the first conductive member is placed between the motor and the printed circuit board.

16. An electronic apparatus having a battery as an electrical power source, comprising
- a housing having a recessed portion;
- a battery provided in the recessed portion of the housing and having a positive electrode and a negative electrode;
- a printed circuit board provided in the housing and an electronic circuit disposed on the printed circuit board; the printed circuit board being provided with two holes and at least one of the holes being formed in the electronic circuit;
- a first conductive member made of a sheet and secured to the printed circuit board; and
- a second conductive member made of a plate contacting an electrode and provided with first and second projections, wherein the second projection has a root portion and an end portion and is longer than the first projection and the first projection has an end portion, and the end portion of the first projection and the root portion of the second projection are inserted into one of the holes to secure at least one of the projections to the electronic circuit with solder so that the plate of the contact member and the second projection contact the first conductive member through the end portion of the second projection.

17. The electronic apparatus of claim 16, wherein
the first conductive member is a reinforcement plate for a printed circuit board other than the printed circuit board disposed in the electronic apparatus.

18. The electronic apparatus of claim 16, further comprising
- a motor; and wherein
- the first conductive member is placed between the motor and the printed circuit board.

* * * * *